United States Patent
Kim et al.

(10) Patent No.: US 8,766,348 B2
(45) Date of Patent: Jul. 1, 2014

(54) SEMICONDUCTOR DEVICE WITH SELECTIVELY LOCATED AIR GAPS AND METHOD OF FABRICATION

(75) Inventors: Tae-Kyung Kim, Palo Alto, CA (US); Woosung Choi, Pleasanton, CA (US)

(73) Assignee: Samsung Electronics Co., Ltd., Suwon-si (KR)

(*) Notice: Subject to any disclaimer, the term of this patent is extended or adjusted under 35 U.S.C. 154(b) by 118 days.

(21) Appl. No.: 13/333,710

(22) Filed: Dec. 21, 2011

(65) Prior Publication Data

US 2013/0161716 A1     Jun. 27, 2013

(51) Int. Cl.
*H01L 27/088*     (2006.01)
*H01L 21/8234*     (2006.01)

(52) U.S. Cl.
USPC ........... 257/314; 257/315; 257/316; 257/368; 257/E21.616; 438/587; 438/201; 438/211

(58) Field of Classification Search
CPC ............ H01L 27/108; H01L 27/11521; H01L 21/28273; H01L 27/11568; H01L 27/115; H01L 27/11; H01L 27/088; H01L 29/6659; H01L 29/66825; H01L 29/42324
USPC .................. 257/314, 315, 316, 368, E27.06, 257/E21.616; 438/587, 201, 211
See application file for complete search history.

(56) References Cited

U.S. PATENT DOCUMENTS

| 6,720,578 | B2 * | 4/2004 | Lee ................................. 257/64 |
| 6,819,592 | B2 * | 11/2004 | Noguchi et al. .......... 365/185.17 |
| 7,682,900 | B2 * | 3/2010 | Kim et al. ..................... 438/257 |
| 7,683,421 | B2 * | 3/2010 | Buh et al. ....................... 257/314 |
| 8,362,542 | B2 * | 1/2013 | Kang et al. .................... 257/315 |
| 2009/0004814 | A1 * | 1/2009 | Kim et al. ..................... 438/424 |

* cited by examiner

*Primary Examiner* — Thinh T Nguyen
(74) *Attorney, Agent, or Firm* — Sughrue Mion, PLLC

(57) ABSTRACT

A non-volatile semiconductor memory device comprises a semiconductor substrate and a plurality of gate structures formed on a cell region of the semiconductor substrate. The plurality of gate structures include a first select-gate and a second select-gate disposed on the cell region, the first select-gate and the second select-gate spaced apart from each other. A plurality of cell gate structures are disposed between the first select-gate and the second select-gate. The first select-gate and an adjacent cell gate structure have no air gap defined therebetween. At least a pair of adjacent cell gate structures have an air gap defined therebetween.

22 Claims, 8 Drawing Sheets

US 8,766,348 B2

SEMICONDUCTOR DEVICE WITH SELECTIVELY LOCATED AIR GAPS AND METHOD OF FABRICATION

FIELD OF THE INVENTION

The present invention generally relates to semiconductor devices and, more particularly, to semiconductor devices with filled gaps between adjacent gate structures such as select transistors and wordlines, and methods of fabricating the same.

DESCRIPTION OF RELATED ART

Semiconductor devices such as non-volatile memory devices allow retention of information even without a supply of power. There is continuing trend in scaling down the sizes of gate structures and minimizing the space between adjacent gate structures in such semiconductor devices. For example, the scaling down of the NAND Flash memory continues because the density and the semiconductor device chip size are important factors in pricing.

However, such scaling down is hindered by a number of limitations. One limitation is the unwanted programming of unselected memory cells, so called program inhibit disturb in the NAND flash cell operation. Another limitation is cell to cell (i.e., word line to word line) electrostatic coupling for floating gate NAND Flash cells. Existing approaches in addressing such limitations are inappropriate for scaling down because Gate Induced Drain Leakage (GIDL) current becomes larger with scaling down.

BRIEF SUMMARY OF THE INVENTION

According to an embodiment of the invention, a non-volatile semiconductor memory device comprises a semiconductor substrate and a plurality of gate structures formed on a cell region of the semiconductor substrate. The plurality of gate structures includes a first select-gate and a second select-gate disposed on the cell region, wherein the first select-gate and the second select-gate are spaced apart from each other.

A plurality of cell gate structures are disposed between the first select-gate and the second select-gate. The first select-gate and an adjacent cell gate structure have no air gap defined therebetween. At least a pair of adjacent cell gate structures have an air gap defined therebetween.

In one embodiment, at least a portion of space between the first select-gate and said adjacent cell gate structure contains a material for increasing capacitive coupling between the first select-gate and said adjacent cell gate structure. In one embodiment said material comprises a dielectric material or a high-k dielectric material.

In one embodiment, the first select-gate comprises a string select gate. In another embodiment, the first select-gate comprises a ground select gate. In another embodiment, the first select-gate comprises a ground select gate, and the second select-gate comprises a string select gate.

In another embodiment, the first select-gate comprises a string select gate, and the second select-gate comprises a ground select gate. In another embodiment, the second select-gate and an adjacent cell gate structure have no air gap defined therebetween. In another embodiment, the second select-gate and an adjacent cell gate structure have an air gap defined therebetween.

In another embodiment, at least a portion of space between the first select-gate and said adjacent cell gate structure contains a material for reducing GIDL current of the cell gate structure.

In another embodiment, the present invention provides a method fabricating a non-volatile semi-conductor memory device, comprising forming a first pair of adjacent gate structures on a semiconductor substrate without an air gap defined between the first pair of adjacent gate structures. The method further includes forming a second pair of adjacent gate structures on the semiconductor substrate with an air gap defined between the second pair of adjacent gate structures.

These and other features, aspects and advantages of the present invention will become understood with reference to the following description, appended claims and accompanying figures.

DETAILED DESCRIPTION OF THE INVENTION

Embodiments of the invention relate to semiconductor devices, such as NAND flash memory devices, with reduced GIDL current and reduced program disturb, without increasing device chip area. The reduced GIDL current results in reduced GIDL induced disturb. Embodiments of the invention further allow scaling down NAND Flash memory chip size. NAND Flash memory stores information utilizing an array of memory cells comprising floating gate transistors.

According to an embodiment of the invention, a non-volatile semiconductor memory device comprises a semiconductor substrate and a plurality of gate structures formed on a cell region of the semiconductor substrate. The plurality of gate structures includes a first select-gate and a second select-gate disposed on the cell region, wherein the first select-gate and the second select-gate are spaced apart from each other.

A plurality of cell gate structures are disposed between the first select-gate and the second select-gate. The first select-gate and an adjacent cell gate structure have no air gap defined therebetween. At least a pair of adjacent cell gate structures have an air gap defined therebetween.

In one embodiment, at least a portion of space between the first select-gate and said adjacent cell gate structure contains a material for increasing capacitive coupling between the first select-gate and said adjacent cell gate structure. For example, said material may comprise a dielectric material or a high-k dielectric material.

In one embodiment, the first select-gate comprises a string select gate. In another embodiment, the first select-gate comprises a ground select gate. In another embodiment, the first select-gate comprises a ground select gate, and the second select-gate comprises a string select gate.

In another embodiment, the first select-gate comprises a string select gate, and the second select-gate comprises a ground select gate. In another embodiment, the second select-gate and an adjacent cell gate structure have no air gap defined therebetween. In another embodiment, the second select-gate and an adjacent cell gate structure have an air gap defined therebetween.

Figure 1A:
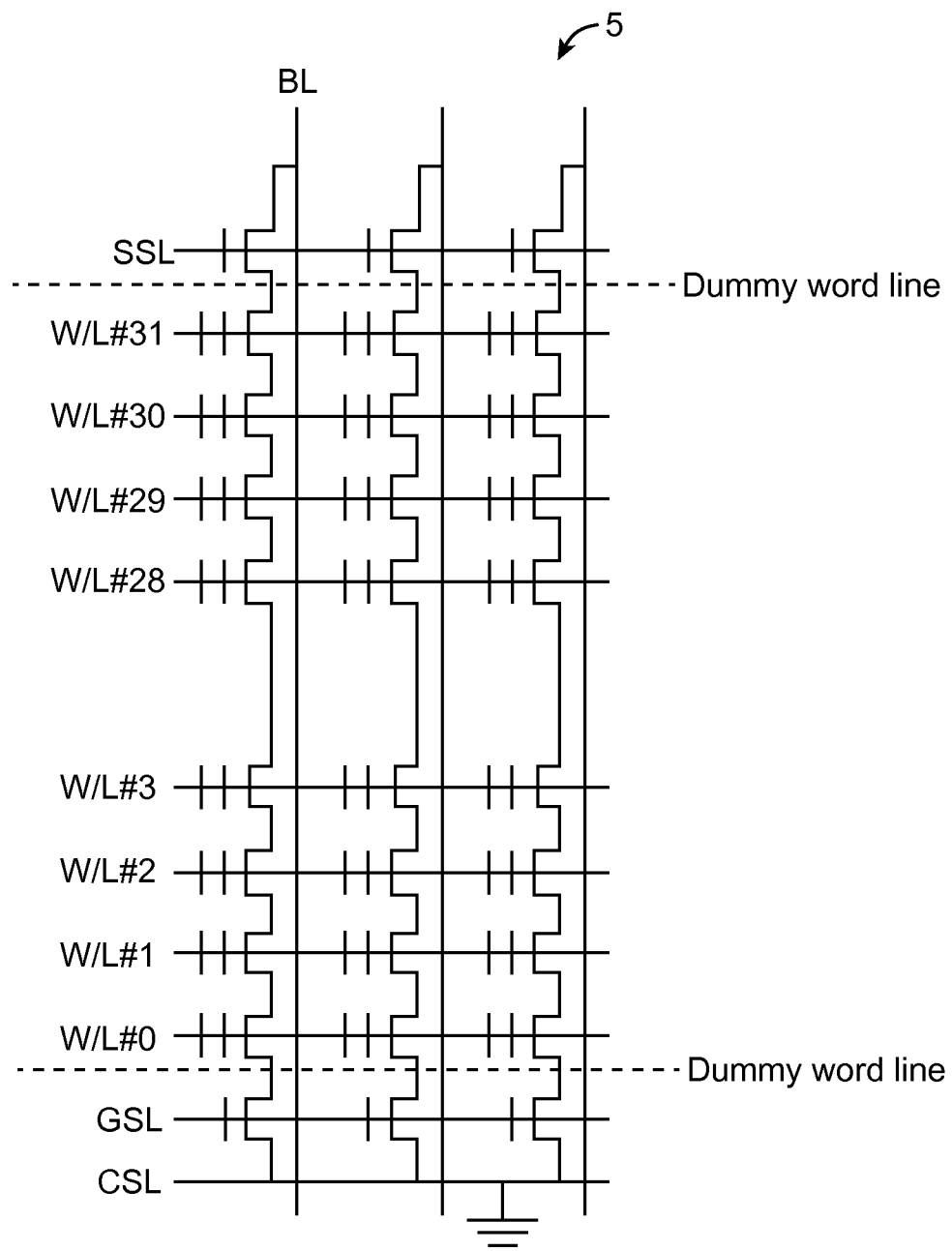
FIG. 1A shows a circuit diagram of a NAND flash memory array, according to an embodiment of the invention.
Figure 1B:
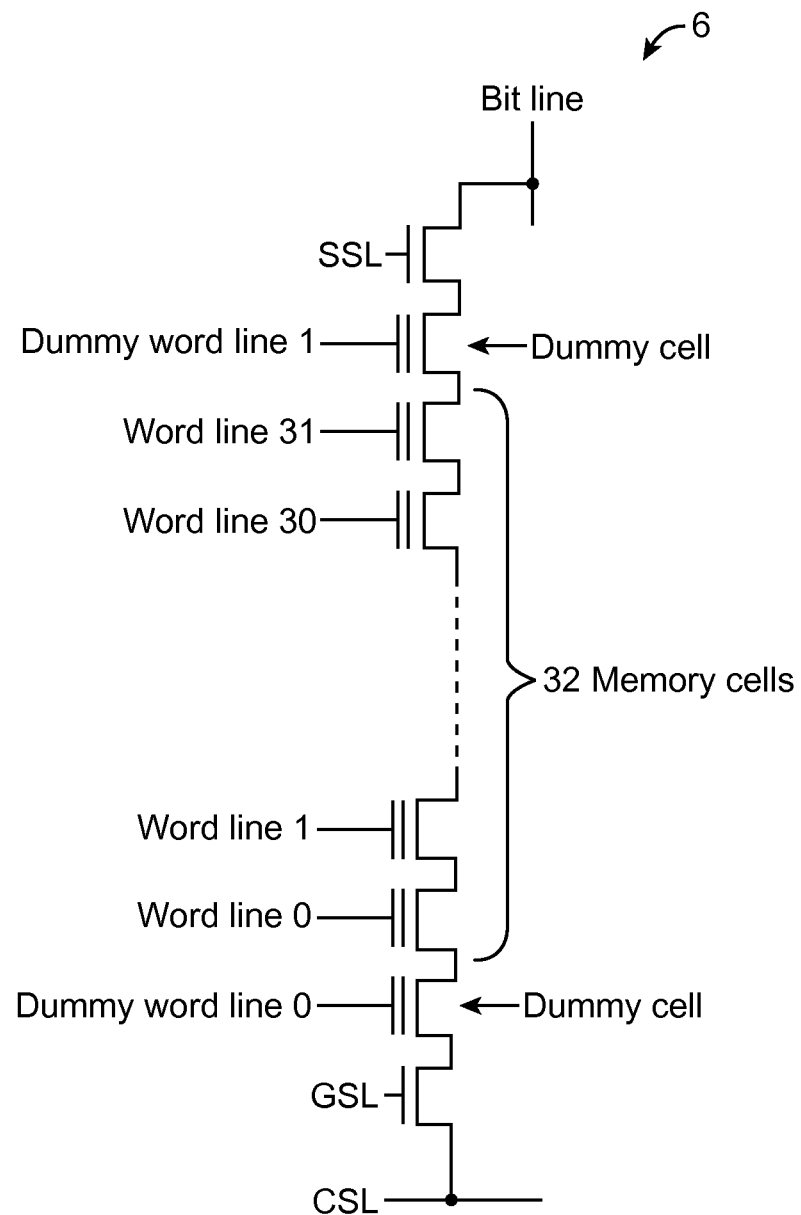
FIG. 1B shows a more detailed circuit diagram of a NAND flash memory array, according to an embodiment of the invention.

In another embodiment, at least a portion of space between the first select-gate and said adjacent cell gate structure contains a material for reducing GIDL current of the cell gate structure. FIG. 1A is a circuit diagram of a NAND flash memory array 5, according to an embodiment of the invention. The NAND flash memory array 5 includes a string select line (SSL), a ground select line (GSL), a common source line (CSL), a plurality of word lines (W/L) #0-31, a plurality of bit lines (BL) crossing across the other lines, and dummy word-lines. FIG. 1B is a more detailed circuit diagram of the NAND flash memory array 6, showing structure of dummy word-lines, according to an embodiment of the invention.

Figure 2:
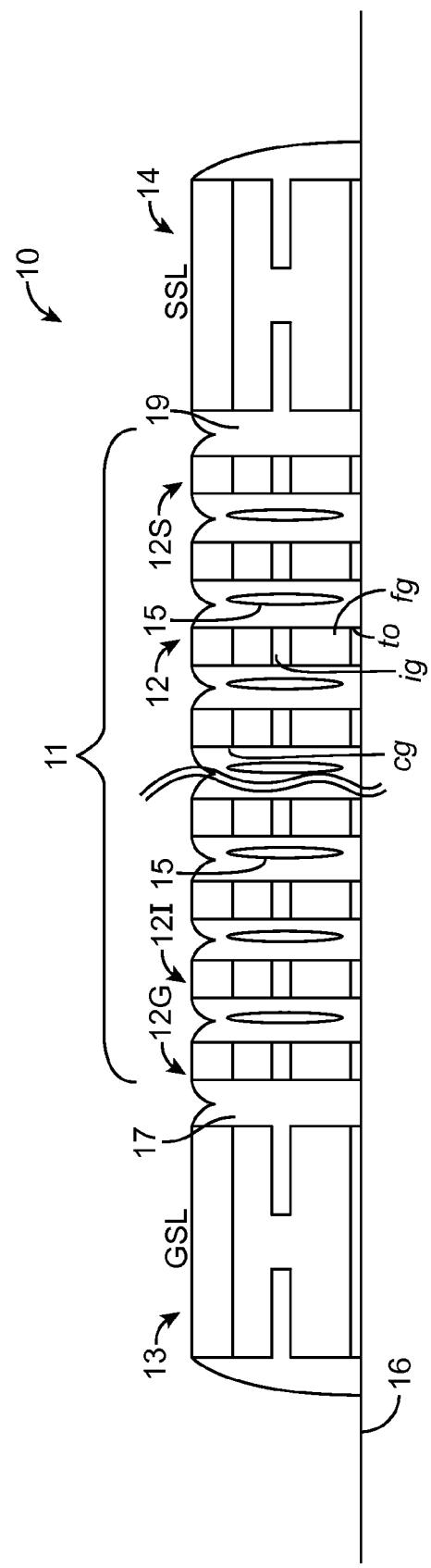
FIG. 2 shows a cross-sectional view of a NAND flash memory structure, according to an embodiment of the invention.

FIG. 2 shows a view of an embodiment of a NAND flash memory semiconductor device 10, according to an embodiment of the present invention. Specifically, FIG. 2 is a cross-sectional view of the device structure taken along the bit line direction. The device 10 comprises an array 11 of cells (gate structures) 12. In the word line direction, a cell transistor gate structure may include an essentially laminar structure including a control gate (cg), an inter-gate dielectric layer (ig), a floating gate (fg), a tunnel oxide (to), and isolation regions formed/disposed on a semiconductor substrate 16.

The set of cells 12 along the bit line is called a string. The device 10 further includes a first select transistor 13 (e.g., Ground/Gate Select Line (GSL) transistor), and a second select transistor 14 (e.g., Source/String Select Line (SSL)). The transistor select-gate structures 13 and 14 selectively control the on/off states of the string 11.

Program inhibited cell strings have a channel potential self-boosted by turning off select transistors such as the selected transistors 13 and 14. When programming is performed according to a row decoded address, one of the word lines is selected and set to a high programming voltage Vpgm (e.g., 15~20V) and all the other word lines are applied to a pass voltage Vpass (e.g., 8~10V).

According to a column decoded address, a bit line is selected to be programmed and its channel is opened by turning on the SSL transistor 14. For the other bit line strings that should be inhibited from programming, the following scheme can be applied. The high Vpgm applied to the selected word line and the Vpass applied to the other word lines, lift the channel potential when the program inhibited string is off. As a result, the channel potential of the program inhibited bit line is boosted as high as (e.g., 5~7V).

The source of the GIDL current is the Band to Band tunneling (BTBT) due to the large potential drop between the boosted channel below the word lines and the channel under GSL. Some of the BTBT generated carriers obtain high energy that is enough to allow them to go over the barrier height of the tunneling oxide of the cells (gate structures), which causes the problematic program inhibit disturb behavior in the inhibited strings.

In one embodiment of the invention, filled gaps in areas between chosen adjacent gate structures in the device 10 reduce the GIDL current for NAND flash memory cells. In the example shown in FIG. 2, the chosen adjacent gate structures are the select transistor gate structures (e.g., GSL and/or SSL) and a first neighboring word line (e.g., dummy world line), to reduce the GIDL current.

For example, there is no air gap between the GSL transistor 13 and its nearest word line 12G (e.g., dummy W/L (DW/L)), and there is no air gap between the SSL transistor 14 and its nearest word line gate structure 12S. The area between other adjacent gate structures 12 is filled with an oxide dielectric layer with a relatively small air pocket 15.

In one embodiment of the invention, a portion of the dielectric in areas between chosen adjacent gate structures is replaced with high-k dielectric materials such as materials with a higher dielectric constant than silicon dioxide. In one embodiment, dimensions between two select-gates (e.g., select gates 13 and 14) are essentially based on the cell pitch and the number of cell word-lines 12. For example, if there are 64 word lines 12 and 2 dummy word lines 12G and 12S with about a 21 nm word line size, total spatial dimensions are: 66*cell pitch (42 nm) plus half pitch (21 nm). Calculated total dimension is 66*42+21=2790 nm. Dimensions for dielectric materials are also essentially based on the size of space between word-lines 12. Generally, space between the word-lines 12 are similar to the individual word-line size, which is half pitch of the cell design rule. In one example, space between a select-gate and the neighboring word-line are around the half pitch or more.

As a result of utilizing said high-k dielectric materials between gate structures, according to embodiments of the invention, the capacitive coupling between such gate structures is increased. In one embodiment, replacing a portion of the dielectric between a select transistor and a first neighboring word line results in reduced GIDL current under the select transistor. As the GIDL current is reduced, the program disturb behavior is improved.

According to an embodiment of the invention, utilizing silicon dioxide or a high-k dielectric instead of an air gap in the area between a select transistor gate structure and the neighboring gate structure (e.g., word line), enhances capacitive coupling of the select transistor gate structure and the neighboring word line gate structure.

For example, in the device 10 shown in FIG. 2, the area 17 between the dummy word line gate structure 12G and the GSL transistor gate structure 13 includes silicon dioxide, instead of an air gap. Optionally, similarly the area 19 between the dummy word line gate structure 12S and the SSL transistor 14 may include silicon dioxide, instead of an air gap.

According to embodiments of the invention, GIDL current is decreased by the gradual electric potential between the select transistors and nearest word line (as shown by example in FIG. 5, described further below).

Figure 3:
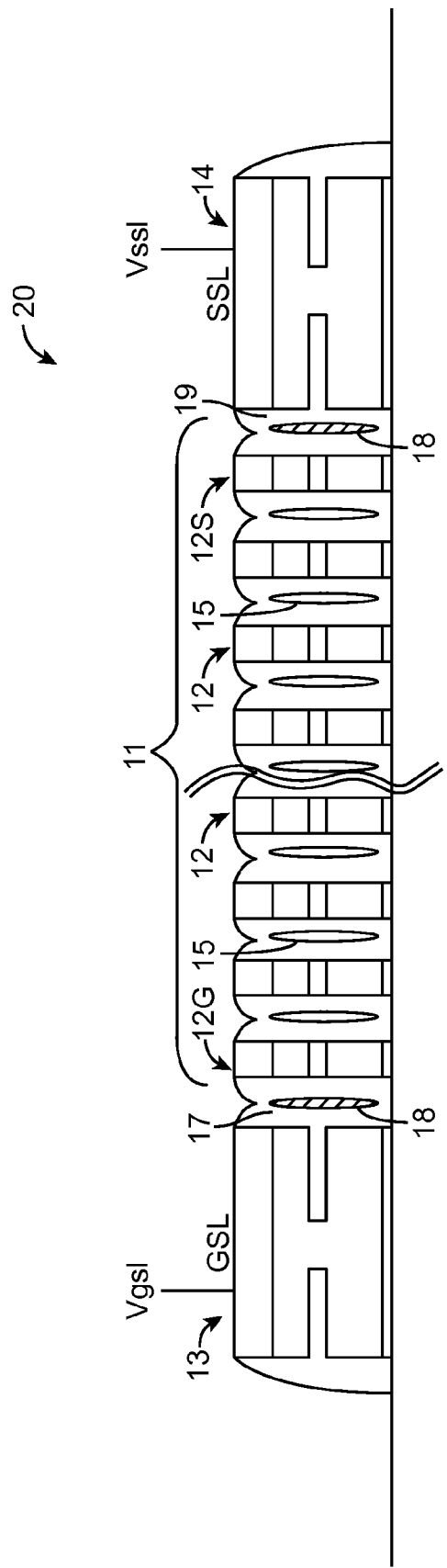
FIG. 3 shows a cross-sectional view of a NAND flash memory structure, according to another embodiment of the invention.

Referring to FIG. 3, in another example NAND flash memory device 20 according to an embodiment of the invention, the area 17 between the dummy word line gate structure 12G and the GSL transistor 13 in a NAND flash memory device 20 includes a high-k dielectric 18, instead of an air gap. Optionally, similarly the area 19 between the dummy word line gate structure 12S and the SSL transistor gate structure 14 may include a high-k dielectric 18, instead of an air gap.

Said enhanced coupling effect lowers potential of the word line gate structure 12G, and reduces the boosted channel potential under the word line gate structure 12G. Further, reduced potential difference between gate structure 12G channel and the GSL transistor 12 due to said enhanced coupling effect, reduces the GIDL current.

Figure 4:
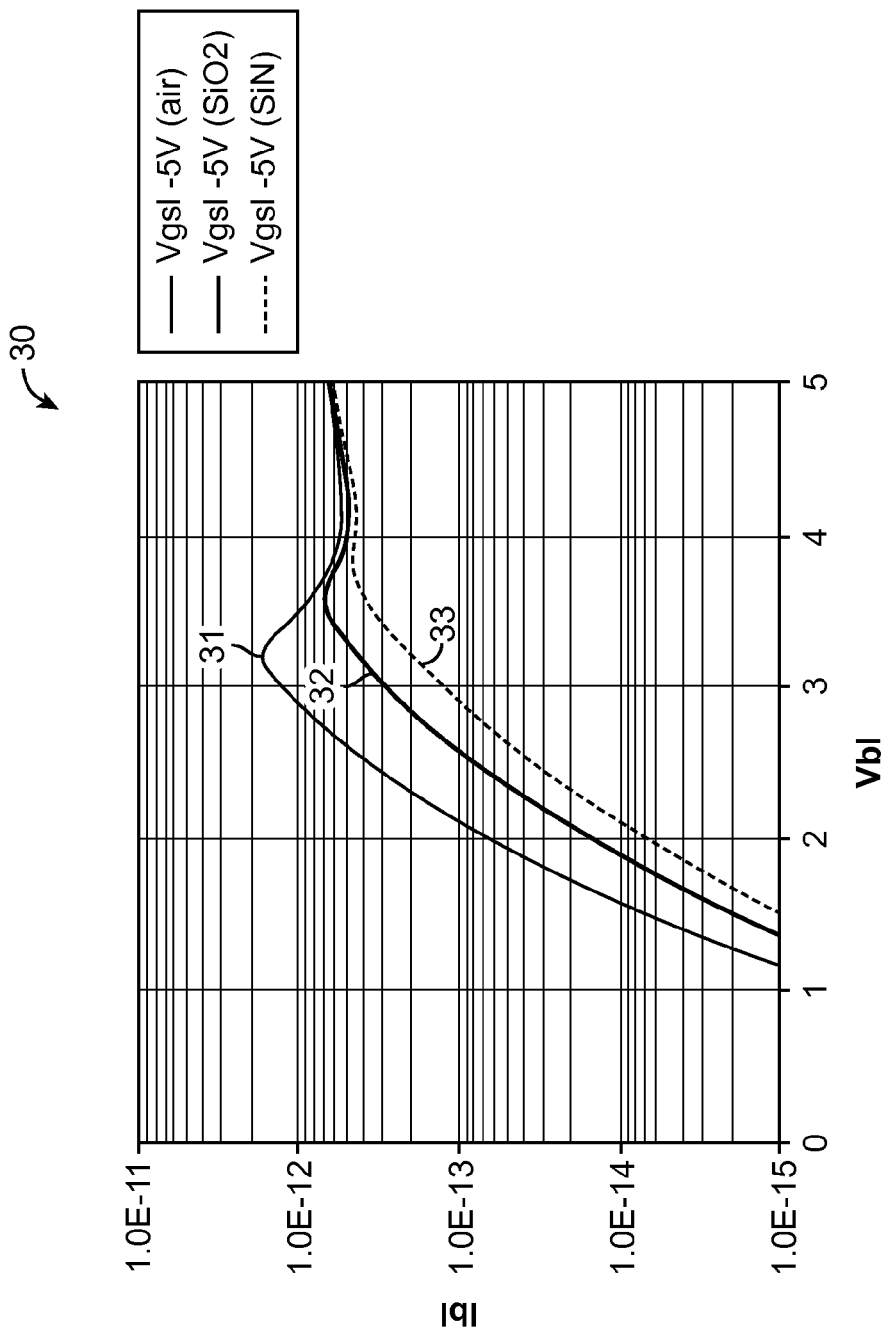
FIG. 4 shows a diagram representing bit line current comprising mainly GIDL current for different NAND flash memory devices, according to an embodiment of the invention.

FIG. 4 shows a diagram 30 of graphs 31, 32 and 33 representing bit lines current comprising mainly GIDL current, for different NAND flash memory devices. A first graph 31 relates to a conventional NAND flash memory device with air gap (relative permittivity 1.0) in area between GSL transistor gate structure and nearest word line gate structure. Such an air gap reduces the coupling effect on the neighboring gate structures.

A second graph 32 relates to a NAND flash memory device (such as device 10 in FIG. 2) with silicon dioxide (SiO2, relative permittivity 3.9) in area 17 between GSL transistor gate structure 13 and nearest word line gate structure 12G, according to an embodiment of the invention. A third graph 33 relates to a NAND flash memory device (such as device 20 in FIG. 3) with nitride (SiN, relative permittivity 7.5) in area 17 between GSL transistor gate structure 13 and nearest word line gate structure 12G, according to an embodiment of the invention.

As can be seen in FIG. 4, according to embodiments of the invention, there is a reduction in the GIDL current under the gate structure 12G as indicated by graphs 32 and 33, as a result of reduction in BTBT due to said enhanced coupling from silicon dioxide and nitride in area 17 (instead of air gaps), respectively.

Figure 5:
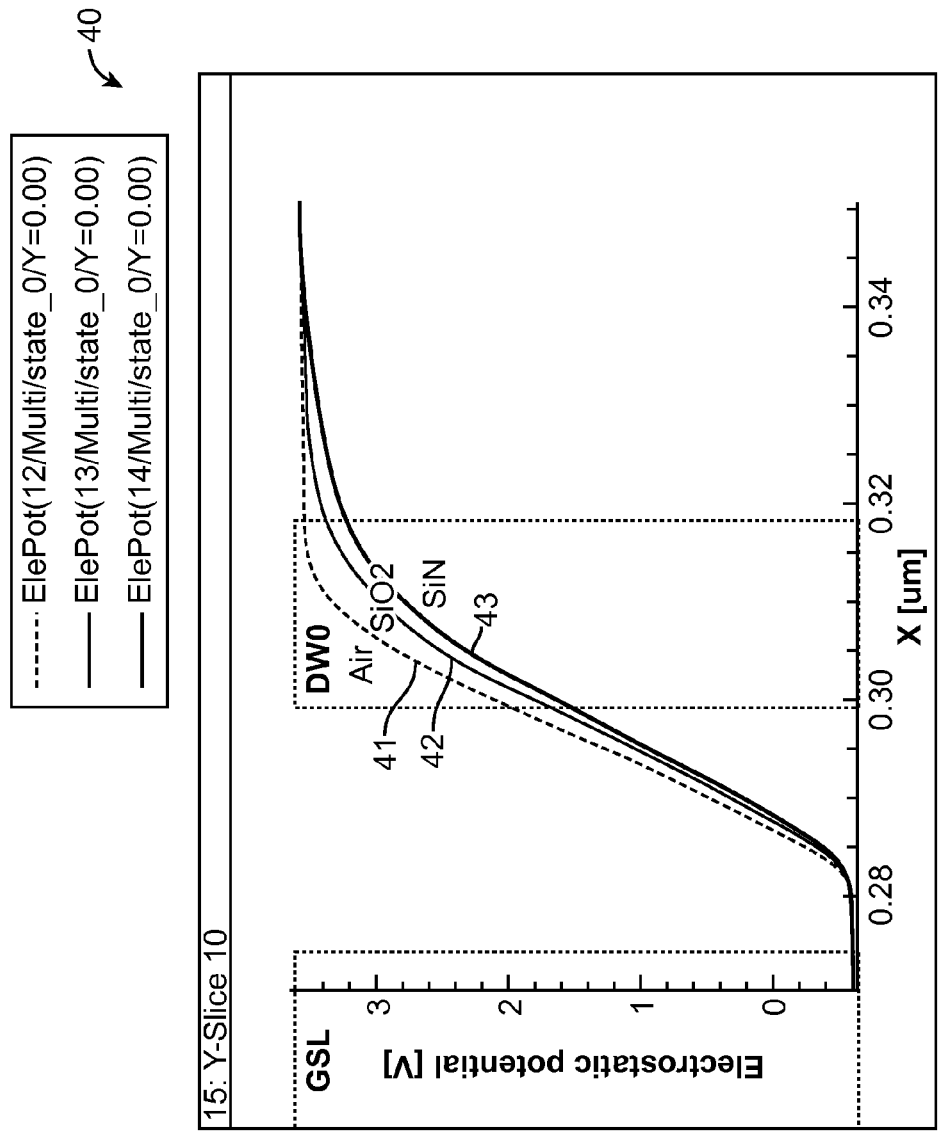
FIG. 5 shows a diagram of GSL electric potential profiles under the gate structure for different NAND flash memory devices, according to an embodiment of the invention.

FIG. 5 shows a diagram 40 of GSL electric potential profiles 41, 42, 43 under the gate structure 12G (DW0), corresponding to bit line currents 31, 32, 33, in FIG. 4, respectively. This shows that the effective GSL electrostatic potential difference drops considerably as the air gap in the area 17 is filled with silicon oxide or nitride.

In one embodiment, the invention provides asymmetry of spacing between the GSL transistor structure and its nearest word line gate structure, and the spacing between the SSL transistor and its nearest word line gate structure. Specifically, an asymmetric application of air gaps in a NAND flash memory device involves an asymmetric GSL/SSL structure, wherein there is no air gap between GSL transistor and its nearest word line gate (cell gate) structure, and there is air gap between SSL transistor and its nearest word line gate structure.

Figure 6:
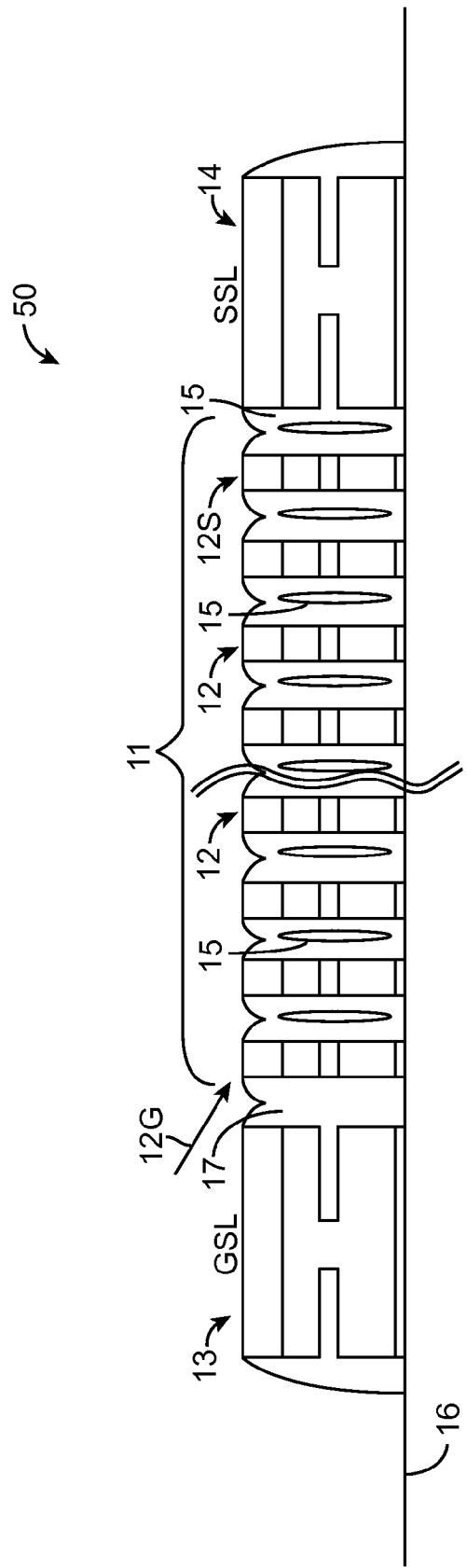
FIG. 6 shows a cross-sectional view of a NAND flash memory structure, according to another embodiment of the invention.

As such, in one embodiment of the invention as shown by the device 50 in FIG. 6, the removal of air gap or filling with high-k dielectrics is performed only on the GSL side of the array 11, and having the SSL with an air gap 15 in the spacing between the SSL transistor 14 and its nearest word line gate structure 12S. In such an asymmetric GSL/SSL structure in a NAND flash memory device, the weaker coupling between SSL transistor and the nearest/neighboring word line structure is functionally preferred.

In another embodiment, a method for fabricating non-volatile semiconductor memory device comprises forming a first pair of adjacent gate structures (e.g., gate structures 13 and 12G in FIG. 2) on a semiconductor substrate without an air gap defined between the first pair of adjacent gate structures. The method further comprises forming a second pair of adjacent gate structures (e.g., gate structures 12G and 12I in FIG. 2, or gate structures 14 and 12S in FIG. 6) on the semiconductor substrate with an air gap defined between the second pair of adjacent gate structures.

According to embodiments of the invention, selectively located air gaps effectively control the disturbance characteristics due to coupling effect on the neighboring word lines. Conventional air gap processes use high depo-rate inter dielectric deposition to achieve air gaps by less conformal deposition behavior. High depo-rate deposition automatically closes the opening between all of the gate structures in a NAND flash memory device, including those between the select transistors and their nearest wordlines. After closing the opening, space between gates remains as an air gap.

According to an embodiment of the invention, the physical size of gate structures and their spacing may be optimized, for example, using experimental optimization.

Figure 7:
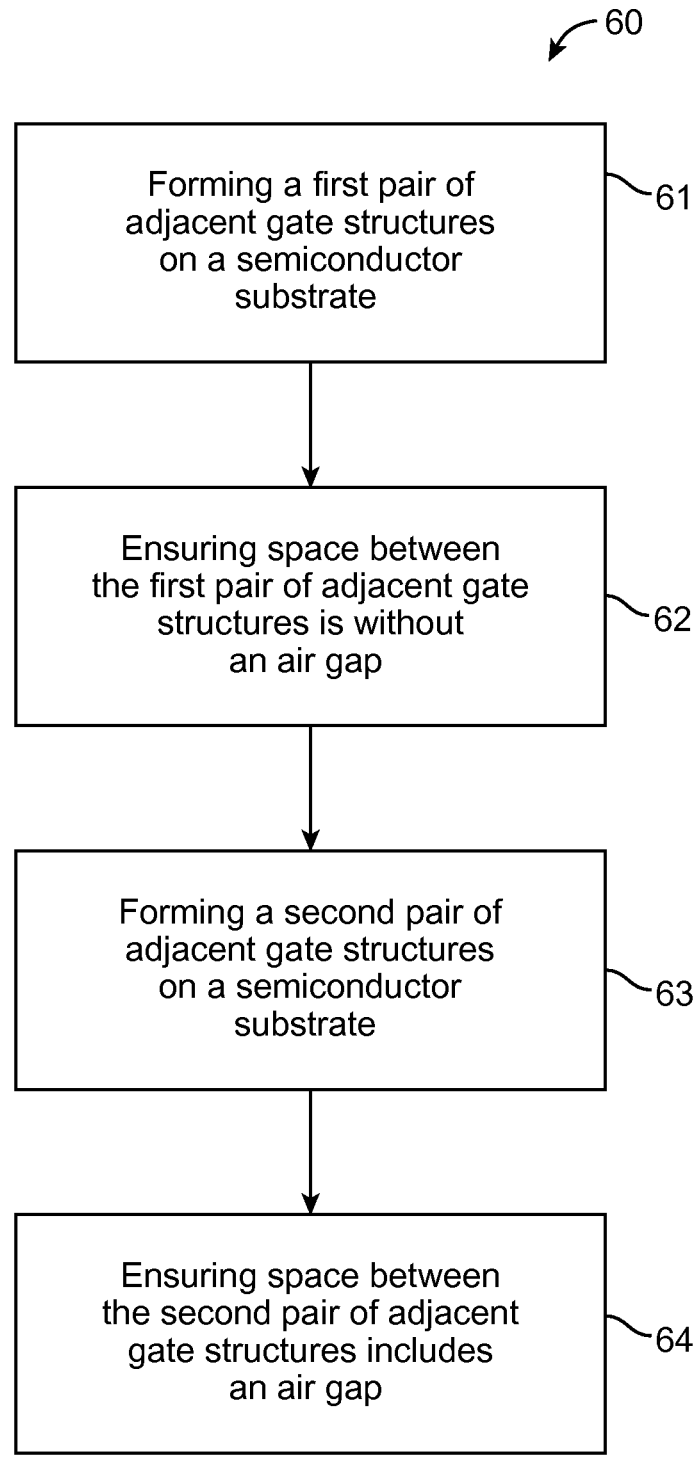
FIG. 7 shows a flowchart of a process for fabricating a non-volatile semiconductor memory device, according to an embodiment of the invention.

FIG. 7 shows a flowchart of a process 60 for fabricating a non-volatile semiconductor memory device, according to an embodiment of the invention. Step 61 comprises forming a first pair of adjacent gate structures on a semiconductor substrate. Step 62 comprises ensuring space between the first pair of adjacent gate structures is without an air gap.

In one embodiment of the invention, any air gap between a select transistor gate structure and a first neighboring word line gate structure is removed by increasing the distance between said two gate structures during fabrication of the NAND flash memory cells.

In one embodiment of the invention, after InterLayer Dielectric deposition in wafer fabrication, the remaining space between the select transistor gate structure and the first neighboring word line is filled with a conventional passivation material (e.g., silicon dioxide or silicon nitride), or high-k material to increase the capacitive coupling further.

In one embodiment of the invention, the air gap between chosen gate structures (e.g., between select transistor gate structure and the first neighboring word line) is removed and the spacing between the chosen gate structures is optimized (e.g., reduced) to reduce the GIDL current. In one implementation, the spacing is filled with high-k dielectric materials. For example, on one embodiment of the invention, the size of the select transistor gate structure is reduced relative to nearest (neighboring) word line gate structure in the NAND flash memory device.

Step 63 comprises forming a second pair of adjacent gate structures on the semiconductor substrate. Step 64 comprises ensuring an air gap is defined in space between the second pair of adjacent gate structures.

Embodiments of the invention use an air gap at the space between the word lines gate structures in order to reduce the electric coupling effect in between the word line gate structures.

Conventional air gap processes form an air gap between the select transistors and the nearest word lines as well as forming air gaps in the space between the word lines.

According to an embodiment of the invention, air gaps are formed only at the spaces between the cell word lines, and the space between select transistors and nearest word lines are filled by filling materials (no air gaps), in order to reduce GIDL leakage current at the select transistors. Example filling materials include silicon dioxide, silicon nitride and high-k dielectrics. According to embodiments of the invention, the air gap at the space between select transistors and neighboring word lines is filled with dielectric materials.

According to an embodiment of the invention, the air gap next to a select transistor is filled with dielectric materials such as silicon oxide, silicon nitride or high-k materials. For example, the GSL side in a NAND flash memory device is fabricated without an air gap between the GSL transistor and nearest word line gate structure, or with a high-k dielectric between the GSL transistor and nearest word line gate structure. In one example, the SSL side is fabricated following a conventional air gap structure (i.e., with an air gap between the SSL transistor and nearest word line gate structure).

According to an embodiment of the invention, air gap formation is prevented in areas (spaces) between chosen gate structures, wherein gate structure and gate spacing is controlled to enhance conformality at the chosen gate structure locations in the NAND flash memory device. For example, a round shape gate structure and wide opening of the area (space) between gate structures help conformal deposition which prevent air gap formation.

According to an embodiment of the invention, to replace an air gap with high-k dielectric material, typical inter dielectric is deposited in advance, leaving vacant a remaining portion of the area (space) between gate structures (e.g., between GSL transistor and nearest word line gate structure) without dielectric material. Subsequently, high-k dielectric material is deposited to fill that remaining space.

Semiconductor devices, e.g., non-volatile memory devices formed according to some of the embodiments described herein can be used in various electronic systems such as cellular phones, digital cameras, digital televisions, and video game systems. Additionally, the memory devices can be used in various types of memory cards such as Compact Flash, Memory Stick, xD Picture Card, Smart Media, and other multimedia card types. Further, non-volatile memory devices may be operatively coupled with other types of semiconductor devices, such as dynamic random access memory (DRAM) devices and/or microprocessors, in the foregoing applications. In some cases, a non-volatile memory such as a NAND flash memory device and a DRAM device may be incorporated together in a single integrated circuit (IC) package, also known as a ND chip.

The foregoing description is illustrative and is not to be construed as limiting of the disclosure. Although a few example embodiments have been described, those skilled in the art will readily appreciate that many modifications are possible in the example embodiments without materially departing from the novel teachings and advantages of the disclosure. For example, the embodiments have been described with respect to NAND flash memory applications, but the inventive principles could also be applied to other types of memory devices, such as NOR-type flash memories. Accordingly, all such modifications are intended to be included within the scope of the disclosure as defined in the claims.

What is claimed is:

1. A semiconductor device, comprising:
   a first pair of adjacent gate structures disposed on a semiconductor substrate, the first pair of adjacent gate structures comprising a ground select transistor (GSL) gate structure and a neighboring gate structure adjacent to the GSL gate structure; and
   a second pair of adjacent gate structures disposed on the semiconductor substrate, the second pair of adjacent gate structures comprising a source select transistor (SSL) gate structure and a neighboring gate structure adjacent to the SSL gate structure;
   wherein the first pair of adjacent gate structures have no air gap defined therebetween, and the second pair of adjacent gate structures have an air gap defined therebetween.

2. The device of claim 1, wherein at least a portion of a space between the first pair of adjacent gate structures contains a material for increasing capacitive coupling between the first pair of adjacent gate structures.

3. The device of claim 2, wherein said material comprises dielectric material.

4. The device of claim 2, wherein said material comprises dielectric high-k material.

5. The device of claim 2, wherein said material comprises nitride.

6. The device of claim 2, wherein said material comprises silicon dioxide.

7. The device of claim 1, wherein at least a portion of a space between the first pair of gate structures contains a material for reducing Gate Induced Drain Leakage (GIDL) current of the gate structures.

8. A non-volatile semiconductor memory device, comprising:
   semiconductor substrate;
   a plurality of gate structures formed on a cell region of the semiconductor substrate;
   wherein the plurality of gate structures includes:
   a first select-gate and a second select-gate disposed on the cell region, the first select-gate and the second select-gate spaced apart from each other; and
   a plurality of cell gate structures disposed between the first select-gate and the second select-gate;
   wherein the first select-gate comprises a ground select gate, and the second select-gate comprises a string select gate,
   wherein the first select-gate and an adjacent cell gate structure have no air gap defined therebetween, and at least a pair of adjacent cell gate structures comprising the second select-gate and an adjacent cell gate structure have an air gap defined therebetween.

9. The device of claim 8, wherein the second select-gate and an adjacent cell gate structure have an air gap defined therebetween.

10. The device of claim 8, wherein at least a portion of space between the first select-gate and said adjacent cell gate structure contains a material for increasing capacitive coupling between the first select-gate and said adjacent cell gate structure.

11. The device of claim 10, wherein said material comprises dielectric material.

12. The device of claim 10, wherein said material comprises dielectric high-k material.

13. The device of claim 10, wherein said material comprises nitride.

14. The device of claim 10, wherein said material comprises silicon dioxide.

15. The device of claim 8, wherein at least a portion of space between the first select-gate and said adjacent cell gate structure contains a material for reducing Gate Induced Drain Leakage (GIDL) current of the cell gate structure.

16. A method for fabricating a non-volatile semiconductor memory device, the method comprising:
   forming a first pair of adjacent gate structures on a semiconductor substrate without an air gap defined between the first pair of adjacent gate structures, the first pair of adjacent gate structures comprising a ground select transistor (GSL) gate structure and a neighboring gate structure adjacent to the GSL gate structure; and
   forming a second pair of adjacent gate structures on the semiconductor substrate with an air gap defined between the second pair of adjacent gate structures, the second pair of adjacent gate structures comprising a source select transistor (SSL) gate structure and a neighboring gate structure adjacent to the SSL gate structure.

17. The method of claim 16, wherein forming the first pair of adjacent gate structures comprises forming a select line gate and a neighboring gate structure such that at least a portion of a space between the select line gate and said neighboring gate structure contains a material for increasing capacitive coupling between the first pair of adjacent gate structures.

18. The method of claim 17, wherein said material comprises dielectric material.

19. The method of claim 17, wherein said material comprises dielectric high-k material.

20. The method of claim 17, wherein said material comprises nitride.

21. The method of claim 17, wherein said material comprises silicon dioxide.

22. The method of claim 16, wherein at least a portion of space between the first pair of adjacent gate structures contains a material for reducing Gate Induced Drain Leakage (GIDL) current of the gate structures.

* * * * *